United States Patent [19]
Dow et al.

[11] Patent Number: 5,659,263
[45] Date of Patent: Aug. 19, 1997

[54] CIRCUIT AND METHOD FOR CORRECTING PHASE ERROR IN A MULTIPLIER CIRCUIT

[75] Inventors: Stephen W. Dow; David K. Lovelace; Jeffrey C. Durec, all of Chandler, Ariz.

[73] Assignee: Motorola, Inc., Schaumburg, Ill.

[21] Appl. No.: 622,536

[22] Filed: Mar. 25, 1996

[51] Int. Cl.$^6$ ........................................... G06F 7/44
[52] U.S. Cl. ............................. 327/356; 327/359
[58] Field of Search ........................ 327/334, 355–362

[56] References Cited

U.S. PATENT DOCUMENTS

| | | | |
|---|---|---|---|
| 3,761,829 | 9/1973 | Spaulding | 327/356 |
| 4,006,353 | 2/1977 | Pierce | 327/356 |
| 4,088,960 | 5/1978 | Osborne | 327/347 |
| 4,394,626 | 7/1983 | Kurihara et al. | 327/154 |
| 4,894,845 | 1/1990 | Jansen et al. | 327/165 |
| 5,438,301 | 8/1995 | Havens et al. | 331/45 |

OTHER PUBLICATIONS

Asad A. Abidi, "Direct-Conversion Radio Transceivers for Digital Communications, IEEE Journal of Solid-State Circuits,", vol. 30, No. 12, Dec. 1995, pp. 1399–1410.

*Primary Examiner*—Toan Tran
*Attorney, Agent, or Firm*—Gary W. Hoshizaki; Robert D. Atkins

[57] ABSTRACT

A circuit and method for reducing a phase error at the output terminal (48) of a multiplier circuit (41) is provided. The phase error arises when first and second input signals having asymmetric signal paths are multiplied in the multiplier circuit (41). A second multiplier circuit (42) multiplies the in-phase and quadrature signals and produces an output signal at an output terminal (49) which contains the phase error but with the opposite polarity as the phase error produced by the first multiplier circuit (41). The signals at the output terminals (48) and (49) are summed in a summing circuit (43) to produce a third output signal in which the phase error is canceled.

21 Claims, 2 Drawing Sheets

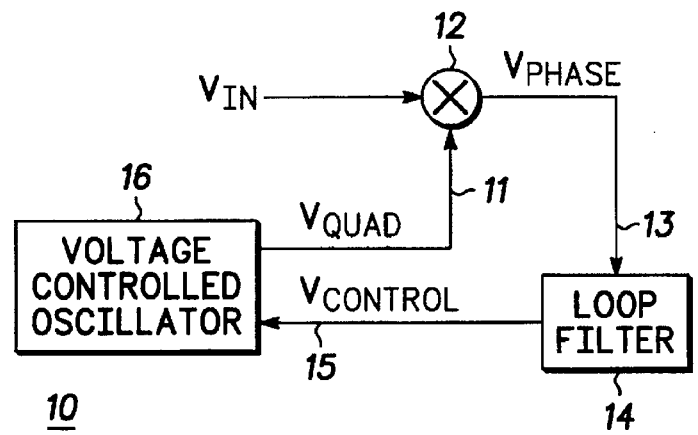
FIG. 1 — PRIOR ART —
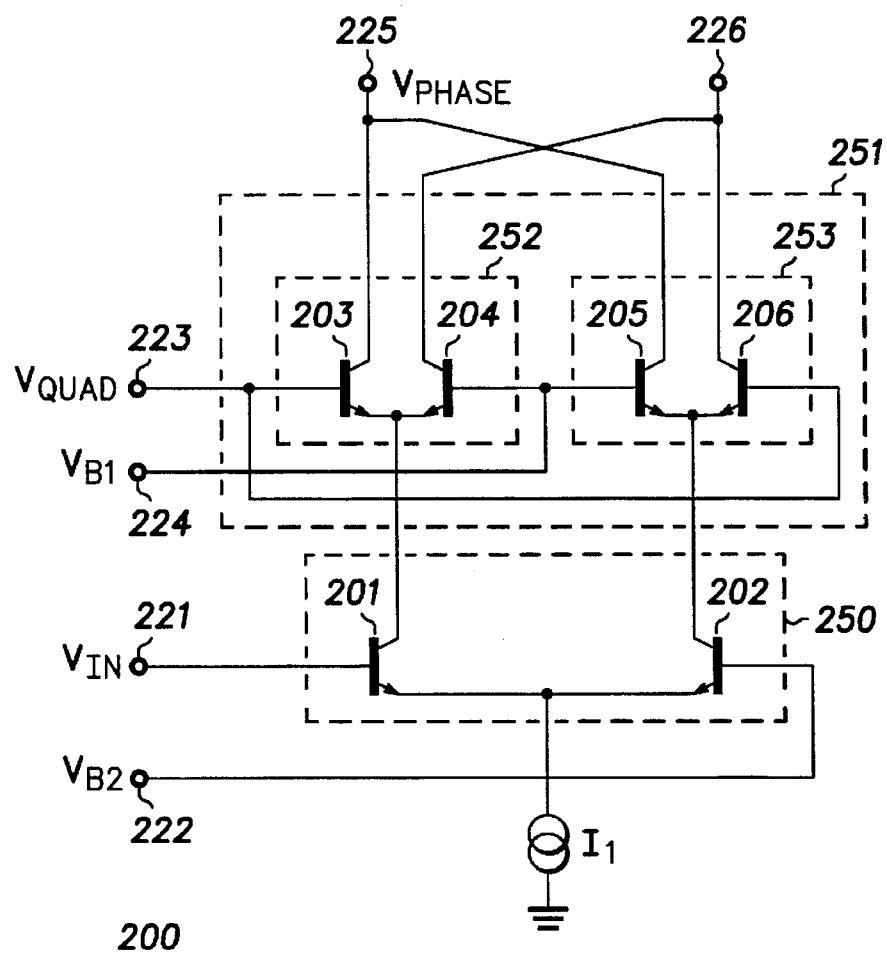
FIG. 2 — PRIOR ART —

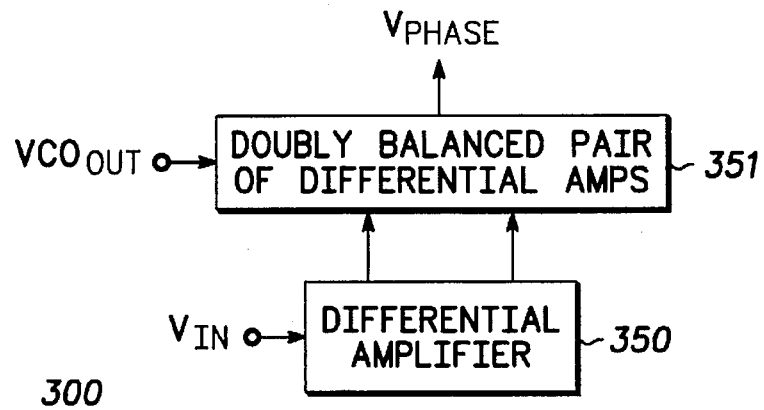
FIG. 3 - PRIOR ART -
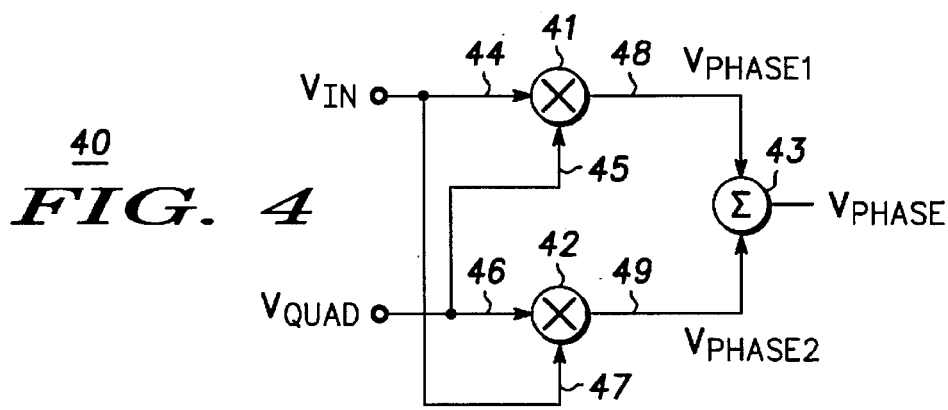
FIG. 4
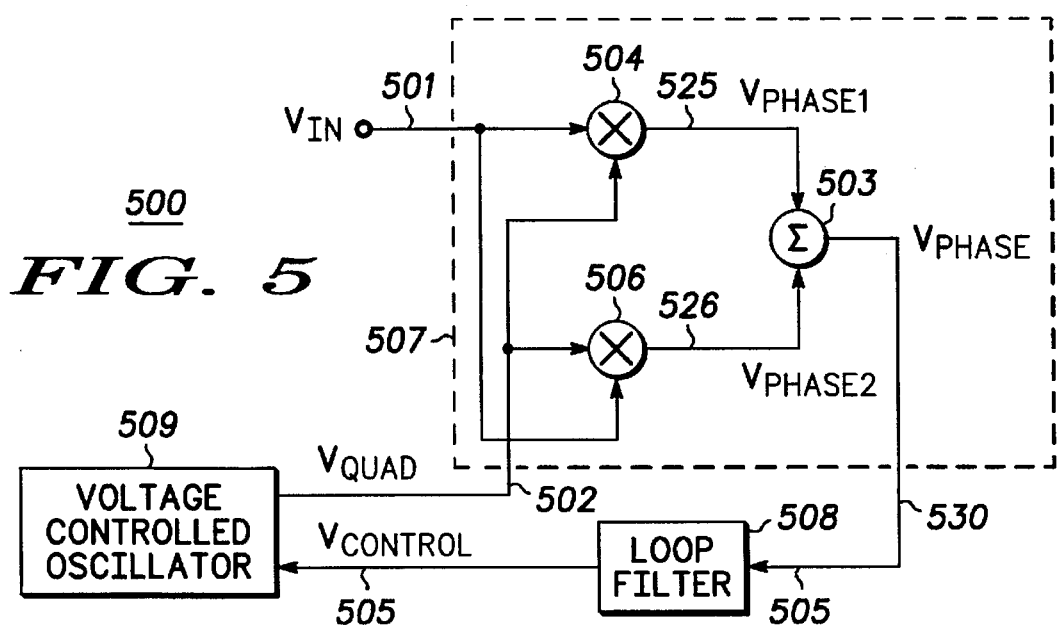
FIG. 5

CIRCUIT AND METHOD FOR CORRECTING PHASE ERROR IN A MULTIPLIER CIRCUIT

BACKGROUND OF THE INVENTION

The present invention relates in general to modulator and demodulator circuits, and more particularly to reducing the phase error of quadrature signals in modulator and demodulator circuits.

Quadrature signals are commonly used in transmitters and receivers in wireless communications systems for modulating and demodulating information signals on a radio frequency carrier signal. They are used in such diverse applications as satellite receivers, cellular and cable telephone systems, global positioning systems and cable television set-top boxes. These applications operate at carrier frequencies between 500 megahertz and 3 gigahertz.

Two signals are in quadrature with respect to each other when they have the same frequency but are 90 degrees apart in phase. Accurate modulation or demodulation requires an in-phase signal and a quadrature signal having a constant amplitude and as small a phase error between it and the in-phase signal as possible. At higher frequencies, however, sufficient accuracy is more difficult to achieve because circuit parasitics and signal propagation delays give rise to phase errors and amplitude variations between the in-phase and quadrature signals that lower the performance of the modulator or demodulator circuits.

Several methods have been devised for generating a quadrature signal from an in-phase or reference signal. For example, one method uses complementary resistor-capacitor and capacitor-resistor phase shift networks to generate a quadrature signal from a reference signal. However, this method is not adequate for systems that must operate over a range of frequencies because it produces a quadrature signal which varies strongly with variations in the frequency of the in-phase signal.

Another method for generating quadrature signals uses an input signal having twice the frequency of the in-phase and quadrature signals. A digital divide-by-two frequency divider generates an in-phase signal from the input signal. The quadrature signal is generated by logically comparing the input and in-phase signals. This method is inadequate for high frequencies because it requires circuits to operate at twice the frequency of the in-phase signal. Another disadvantage is that the resulting quadrature signal does not have a fifty percent duty cycle so that additional circuitry is needed for restoring the quadrature signal so it has a fifty percent duty cycle.

There is a need for an apparatus and a method for reducing phase error in generating a quadrature signal from an in-phase or reference signal in order to increase the accuracy of modulators and demodulators operating at high frequencies. It would be a benefit if the method could generate a quadrature signal having a fifty percent duty cycle and constant amplitude over a range of frequencies without requiring additional circuitry.

BRIEF DESCRIPTION OF THE DRAWINGS

FIG. 1 is a prior art block diagram of a typical phase locked loop;

FIG. 2 is a prior art schematic diagram of a typical phase detector circuit;

FIG. 3 is a prior art simplified block diagram of a Gilbert multiplier circuit;

FIG. 4 is a simplified block diagram of a phase detector circuit in accordance with the present invention; and FIG. 5 is a block diagram of a phase locked loop in accordance with the present invention.

DETAILED DESCRIPTION OF THE DRAWINGS

Quadrature signals are commonly used in transmitters and receivers to modulate or demodulate radio frequency carrier signals in wireless communications systems. Quadrature signals are signals which are 90 degrees out of phase with each other. For wireless communications the modulators and demodulators must operate over a range of frequencies between 500 megahertz and 3 gigahertz.

Accurate modulation or demodulation in a wireless communications transmitter or receiver requires in-phase and quadrature signals which as close to being 90 degrees apart as possible and which have a constant amplitude over a range of frequencies. It is difficult to generate accurate quadrature signals at high frequencies, however, because of phase error related to circuit parasitics and signal propagation delays. Phase errors and amplitude variations between the in-phase and quadrature signals lower the performance of the modulator and demodulator circuits.

A passive method for generating a quadrature signal from a reference signal uses resistor-capacitor networks which shift the phase of the reference signal to generate the quadrature signal. However, this method produces severe amplitude variations in the quadrature signal as the frequency is varied. Another method uses an input signal at twice the desired frequency of operation to generate the reference and quadrature signals. A divide-by-two frequency divider and a series of logic gates produces the reference and quadrature signals at the desired frequency. A disadvantage with this method is that it is limited to lower frequencies because it requires an input signal having twice the frequency of the carrier signal. In a wireless communication application where the quadrature signals are say 3 gigahertz the frequency of the input signal must be 6 gigahertz. A further detriment is that a quadrature signal generated by this method does not have a fifty percent duty cycle so that additional circuitry is needed for generating the fifty percent duty cycle.

Quadrature signals are also generated using feedback loops. For example, by using a phase locked loop both phase and frequency synchronization of the in-phase and quadrature signals are maintained over a range of frequencies. FIG. 1 is a block diagram of a conventional phase locked loop implemented in accordance with the prior art. The phase-locked loop is comprised of a phase detector circuit 12, a loop filter circuit 14 and a voltage controlled oscillator circuit (VCO) 16. The VCO 16 has a control input at terminal 15 and an output at terminal 11 which produces a quadrature signal VQUAD which is adjusted in phase in response to a signal applied to the control input. Modern phase locked loops are commonly integrated on a semiconductor die and produce a quadrature signal having a constant amplitude and a fifty percent duty cycle. They do not need to be operated at twice the carrier frequency in order to produce the quadrature signal.

The phase detector circuit 12 compares the relative phase between an in-phase or reference signal VIN and the quadrature signal VQUAD and produces an output signal VPHASE on terminal 13 which corresponds to the phase difference between VIN and VQUAD. Phase detector circuit 12 is typically implemented as a multiplier circuit which multiplies the in-phase and quadrature signals to produce the output signal VPHASE.

The bandwidth of VPHASE is limited by a loop filter circuit 14 which produces a bandwidth-limited output signal VCONTROL. The output signal VCONTROL is a correction signal which is fed back to the VCO 16 at the control input at terminal 15 for adjusting the phase of the output signal VQUAD. VCONTROL provides zero correction when VIN and VQUAD are in quadrature. If the phase of VQUAD deviates from quadrature with respect to VIN the negative feedback provided by VCONTROL adjusts its phase and returns it to synchronization with VIN. Loop filter circuit 14 is also used for demodulating the in-phase signal VIN.

Accurate modulation or demodulation of a carrier signal in a phase locked loop depends on minimizing phase related error in the phase detector circuit 12. One source of such error is asymmetry in the respective signal paths of the in-phase and quadrature signals through the phase detector circuit 12 which give rise to asymmetric propagation or signal delays for the two signals. The asymmetric signal delays result in VQUAD being shifted away from quadrature which limits the maximum operating frequency of the phase locked loop. For example, when the frequency of the reference signal is one gigahertz a time shift as small as ten picoseconds results in 3.6 degrees of phase error in VQUAD. An error in quadrature of less than one degree is usually needed.

FIG. 2 is a schematic diagram of a typical phase detector circuit 200 implemented in accordance with the prior art. The phase detector circuit 200 is configured as a Gilbert multiplier circuit 200, a doubly balanced multiplier which is readily integrated on a semiconductor die. It should be understood that other phase detector circuits may occur to or be known by a person skilled in the art of such circuits and that the applicability of the present invention is not limited to the particular embodiment of phase detector circuit 200 shown in FIG. 2.

Transistors 201 and 202 form a first differential amplifier 250 which steers current from a current source I1 into the respective common emitter terminals of second and third differential amplifiers 252 and 253 in response to a differential input signal VIN applied to the base of transistor 201 at terminal 221. Second and third differential amplifiers 252 and 253 comprise a doubly-balanced pair of differential amplifiers 251. Biasing voltage VB2 is applied to the base of transistor 202 at terminal 222. Alternatively, input signal VIN is applied to the base of transistor 202 with biasing voltage VB2 connected to the base of transistor 201. As a further alternative, input signal VIN can be a differential signal applied across terminals 221 and 222, in which case biasing voltage VB2 is not used.

The second and third differential amplifiers 252 and 253 direct currents into output terminals 225 and 226 in response to an input signal VQUAD applied to the bases of transistors 203 and 206 at terminal 223. A bias voltage VB1 is applied to the bases of transistors 204 and 205 at terminal 224. Alternatively, input signal VQUAD is connected to terminal 224 with biasing voltage VB1 connected to terminal 223. As a further alternative, input signal VQUAD can be a differential input signal, in which case it is applied across terminals 223 and 224 and VB1 is not used.

Output signal VPHASE is an output current which is taken either from terminal 225 or from terminal 226 as a single ended output signal. Output signal VPHASE has one polarity if it is taken from terminal 225 and the opposite polarity if taken from terminal 226. Alternatively, output signal VPHASE can be a differential output current taken across terminals 225 and 226. For a given phase relationship between VIN and VQUAD the magnitude of VPHASE corresponds to the magnitude of current source I1, so that current source I1 is used to set the gain of the phase detector circuit 200.

The output signal VPHASE is generated by multiplying the two input signals VIN and VQUAD. If the input signals VIN and VQUAD have the same frequency but differ in phase the output signal VPHASE corresponds to the difference in phase. The output signal VPHASE has a magnitude of zero when input signals VIN and VQUAD are in quadrature.

The symmetry at each input results in equal performance of the phase detector circuit 200 regardless of whether VIN and VQUAD are connected as single-ended inputs of either polarity or as differential inputs of either polarity. Similarly, symmetry at the output terminals 225 and 226 results in equal performance regardless of whether the output signal VPHASE is taken as a single-ended output of either polarity or as a differential output of either polarity.

In contrast, the phase detector circuit 200 has an inherent asymmetry between the respective inputs and its performance changes depending on which input receives the respective VIN or VQUAD signals. FIG. 3 is a simplified block diagram of a Gilbert multiplier circuit 500 in accordance with the prior art which shows the inherent asymmetry between the respective signal paths of input signals VIN and VQUAD. The input signal VQUAD passes through the doubly balanced pair of differential amplifiers 351 before causing a change in the output signal VPHASE. In comparison, the input signal VIN passes through differential amplifier 350 as well as through the doubly balanced pair of differential amplifiers 351 before it causes a change in the output signal VPHASE. Because VIN and VQUAD have asymmetric signal paths they have different propagation delays through the Gilbert multiplier circuit 300. The difference results in a phase error signal being included in output signal VPHASE.

If the frequency of VIN is low so that the phase error signal corresponds to a small amount of time in relation to the period of VIN the phase error signal is generally ignored. However, at higher frequencies when the asymmetric signal path delays comprise a significant amount of time compared to the period of VIN the asymmetry contributes a substantial corresponding phase error which limits the usability of the Gilbert multiplier circuit 300 at higher frequencies above 500 megahertz. As mentioned previously, a ten picosecond asymmetry in signal paths results in an error in VPHASE which corresponds to 3.6 degrees of error in the relative phases of the signals VIN and VQUAD. The detriment to system performance resulting from the error in VPHASE increases as the frequency increases.

FIG. 4 is a block diagram of a phase detector circuit 40 configured in accordance with the present invention. The phase detector circuit 40 is readily integrated on a semiconductor die. A first multiplier circuit 41 produces an output signal VPHASE1 at an output terminal 48 in response to input signals VIN and VQUAD being applied to input terminals 44 and 45 respectively. A first signal delay is the time for input signal VIN to propagate from first input 44 to output 48 and a second signal delay is the time for input signal VQUAD to propagate from second input 45 to output 48. An asymmetric signal path delay is equal to the time difference between the first and second signal delays. As shown in equation 1, the output signal VPHASE1 is thereby comprised of a phase signal VPH which corresponds to the phase difference between VIN and VQUAD and a phase error signal VERR which corresponds to the asymmetric signal path delay such that $$VPHASE1 = VPH + VERR \quad (1)$$

A second multiplier circuit 42 has the same gain and signal delay characteristics as first multiplier circuit 41. It is understood that one skilled in the art of such circuits is able to configure the second multiplier circuit 42 such that an output terminal 49 and first and second input terminals 46 and 47 respectively correspond to the output terminal 48 and first and second input terminals 44 and 45 of the first multiplier circuit 41. The first input terminal 46 is connected to input signal VQUAD and has the first signal delay to the output terminal 49. The second input terminal 47 is connected to input signal VIN and has the second signal delay to the output terminal 49. Output signal VP}tASE2 is thereby comprised of a phase signal VPH which corresponds to the phase difference between VIN and VQUAD and a phase error signal -VERR which corresponds to the asymmetric signal path delay but of the opposite polarity as shown in equation 2.

$$VPHASE2 = VPH - VERR \quad (2)$$

The phase error signal -VERR produced by the second multiplier circuit 42 is opposite in polarity to the phase error signal VERR produced by the first multiplier circuit 41 because input signal VIN has the first signal delay through the first multiplier circuit 41 and the second signal delay through the second multiplier circuit 42 whereas input signal VQUAD has the second signal delay through first multiplier circuit 41 and the first signal delay through second multiplier circuit 42.

The output signals VPHASE1 and VPHASE2 on output terminals 48 and 49, respectively, are connected to first and second inputs of a summing circuit 43 which produces a summing output signal VPHASE which is the sum of output signals VPHASE1 and VPHASE2. If the first and second multiplier circuits 41 and 42 are Gilbert multiplier circuits the signals VPHASE1 and VPHASE2 are current signals whose sum is produced by connecting their respective output terminals 48 and 49 to each other, the sum VPHASE thereby being produced at the common terminal. The relationship between the signals VPH and VERR with summing output signal VPHASE is shown in equation 3.

$$VPHASE = (VPH + VERR) + (VPH - VERR) = 2VPH \quad (3)$$

It is seen from this equation that the phase error signal VERR is canceled out by adding to it its equal and opposite phase error signal (-VERR). However, phase information contained in phase signal VPH is retained in summing output signal VPHASE.

FIG. 5 is a schematic diagram of a phase locked loop circuit implemented in accordance with the present invention. A phase detector circuit 507 is comprised of a first multiplier circuit 504, a second multiplier circuit 506 and a summing circuit 503. It has a first input at terminal 501 connected to a carrier signal VIN, a second input at terminal 502 connected to a quadrature signal VQUAD and an output at terminal 530 for producing an output signal VPHASE.

The first multiplier circuit 504 has a first input connected to terminal 501 for receiving an in-phase signal VIN, a second input connected to terminal 502 for receiving a quadrature signal VQUAD and an output at terminal 525 for producing an output signal VPHASE1. First multiplier circuit 504 has asymmetric signal paths from terminals 501 and 502 respectively to terminal 525. Output signal VPHASE1 thus is comprised of a phase signal VPH corresponding to the phase difference or multiplication of VIN and VQUAD and an asymmetric signal path error signal VERR corresponding to the asymmetric signal path delays.

A second multiplier circuit 506 has a first input connected to terminal 502, a second input connected to terminal 501 and an output at terminal 526 for producing an output signal VPHASE2. Second multiplier circuit 506 has asymmetric signal paths from terminals 502 and 501 respectively to the output at terminal 526. The asymmetric signal path delays of the second multiplier circuit 506 are equal to the asymmetric signal path delays of the first multiplier circuit 504. Output signal VPHASE2 is comprised of the phase signal VPH and an asymmetric signal path error signal -VERR where -VERR is equal in magnitude and opposite in polarity to VERR.

A summing circuit 503 has a first input connected to terminal 525 for receiving output signal VPHASE1 from first multiplier circuit 504 and a second input connected to terminal 526 for receiving output signal VPHASE2 from second multiplier circuit 506. Summing circuit 503 produces an output signal VPHASE at terminal 530 which is equal to the sum of output signals VPHASE1 and VPHASE2. Output signal VPHASE thereby corresponds to the phase relationship between in-phase signal VIN and quadrature signal VQUAD but the asymmetric signal path error is eliminated.

A loop filter 508 limits a bandwidth of the output signal VPHASE. It has an input at terminal 530 for receiving output signal VPHASE and an output at terminal 505 for producing a control signal VCONTROL which corresponds to VPHASE but has a more limited bandwidth. Loop filter 508 is also used foe demodulating the in-phase signal VIN.

A voltage controlled oscillator circuit 509 has an input at terminal 505 for receiving control signal VCONTROL from the loop filter 508. It produces a quadrature signal VQUAD at terminal 502. The phase relationship of VQUAD is varied in response to control signal VCONTROL from loop filter 508. If the phase of quadrature signal VQUAD deviates from being 90 degrees out of phase with respect to the phase of in-phase signal VIN the voltage controlled oscillator circuit 509 adjusts the phase of VQUAD in response to the negative feedback provided by control signal VCONTROL. By incorporating the present invention in the phase locked loop the phase error in VQUAD attributable to asymmetric signal paths of VIN and VQUAD through the phase detector circuit 504 is eliminated.

By now it should be appreciated that a method for reducing asymmetrical signal path error when multiplying two signals has been described. The two signals are multiplied to produce a first output signal which has a component corresponding to an asymmetric signal path error. The two signals are again multiplied to produce a second output signal which has an equal and opposite asymmetric signal path error. The first and second output signals are then summed to produce a third output signal in which the asymmetric signal path error is canceled.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. A method of detecting a phase between first and second signals, comprising the steps of:

multiplying the first signal by the second signal to produce a first multiplication signal representative of the phase, where a propagation delay of the first signal through the multiplying step generates a phase error signal in the first multiplication signal;

delaying the second signal to induce the propagation delay in the second signal for producing a delayed second signal;

multiplying the first signal by the delayed second signal to generate a second multiplication signal representative of the phase, where the propagation delay in the second signal generates a correction signal in the second multiplication signal such that the correction signal and the phase error signal have opposite polarities; and summing the first multiplication signal with the second multiplication signal to produce a phase detected signal such that the phase error signal is offset by the correction signal.

2. The method of claim 1, wherein an amplitude of the phase error signal is substantially equal to an amplitude of the correction signal.

3. The method of claim 1, wherein the step of multiplying the first signal by the second signal includes a step of routing the first signal through a first signal path to induce the propagation delay in the first signal.

4. The method of claim 3 wherein the step of delaying the second signal includes a step of routing the second signal through a second signal path.

5. The method of claim 4, further comprising a step of matching the second signal path to the first signal path.

6. The method of claim 5, wherein the step of producing the second multiplication signal includes producing the second multiplication signal having the same polarity as the first multiplication signal.

7. An integrated phase detector, comprising:

a multiplier having an input coupled for receiving a first signal, a first signal path routing a second signal for multiplying by the first signal, and an output providing a first multiplication signal indicative of a phase between the first and second signals, where the first signal path introduces a phase shift in the second signal that generates a phase error in the first multiplication signal at the output;

a second signal path coupled for delaying the first signal to introduce the phase shift in the first signal at an output;

a multiplication stage having a first input coupled for receiving the second signal, a second input coupled to the output of the second signal path and an output providing a second multiplication signal indicative of the phase between the first and second signals, where the second multiplication signal includes a correction signal representative of the phase shift, such that the phase error and the correction signal have opposite polarities; and a summing circuit having a first input coupled to the output of the multiplier, a second input coupled to the output of the multiplication stage, and an output providing a phase detected signal such that the correction signal offsets the phase error.

8. The integrated phase detector of claim 7, wherein the second signal path is matched to the first signal path.

9. The integrated phase detector of claim 8 wherein an amplitude of the correction signal is substantially equal to an amplitude of the phase error.

10. The integrated phase detector of claim 9, wherein the first and second multiplication signals have the same polarity.

11. The integrated phase detector of claim 7, wherein the first signal path includes a first differential amplifier having an input coupled for receiving the second signal.

12. The integrated phase detector of claim 11, wherein the multiplier includes a first doubly balanced amplifier having a first input coupled to an output of the first signal path, and a second input and an output respectively coupled to the input and output of the multiplier.

13. The integrated phase detector of claim 12, wherein the second signal path includes a second differential amplifier having an input coupled for receiving the first signal and an output coupled to an output of the second signal path.

14. The integrated phase detector of claim 13, wherein the multiplication stage comprises a second doubly balanced amplifier having first and second inputs and an output respectively coupled to the first and second inputs and the output of the multiplication stage.

15. An integrated circuit, comprising:

a voltage controllable oscillator (VCO) for producing a quadrature signal at an output in response to a control signal;

a phase detector, including (1) a multiplier having an input coupled for receiving a first signal, a first signal path routing a second signal for multiplying by the first signal, and an output providing a first multiplication signal indicative of a phase between the first and second signals, where the first signal path introduces a phase shift in the second signal that generates a phase error in the first multiplication signal at the output;

(2) a second signal path coupled for delaying the first signal to introduce a phase shift in the first signal at an output;

(3) a multiplication stage having a first input coupled for receiving the second signal, a second input coupled to the output of the second signal path and an output providing a second multiplication signal indicative of the phase between the first and second signals, where the second multiplication signal includes a correction signal representative of the phase shift, such that the phase error and the correction signal have opposite polarities; and (4) a summing circuit having a first input coupled to the output of the multiplier, a second input coupled to the output of the multiplication stage, and an output providing the control signal such that the correction signal offsets the phase error.

16. The integrated circuit of claim 15, further comprising a loop filter for limiting a bandwidth of the control signal.

17. The integrated circuit of claim 16, wherein the second signal path is matched to the first signal path.

18. The integrated circuit of claim 17, wherein an amplitude of the correction signal is substantially equal to an amplitude of the phase error.

19. The integrated circuit of claim 18, wherein the first and second multiplication signals have the same polarity.

20. A method of reducing error in a multiplication signal, comprising the steps of:

multiplying a first signal by a second signal to produce a first multiplied signal, where the first signal undergoes a first propagation delay and the second signal undergoes a second propagation delay longer than the first propagation delay;

multiplying the first signal by the second signal to produce a second multiplied signal, where the second signal undergoes the first propagation delay and the first signal undergoes the second propagation delay longer than the first propagation delay; and summing the first multiplied signal with the second multiplied signal to produce the multiplication signal.

21. An integrated phase detector, comprising:

a first multiplier having a first input coupled for receiving a first signal, a second input coupled for receiving a second signal, and an output for providing a first multiplied signal, where the first multiplier has a first propagation delay from the first input to the output and a second propagation delay from the second input to the output longer than the first propagation delay of the first multiplier;

a second multiplier having a first input coupled for receiving the second signal, a second input coupled for receiving the first signal, and an output for providing a second multiplied signal, where the second multiplier has a first propagation delay from the first input to the output and a second propagation delay from the second input to the output longer than the first propagation delay of the second multiplier; and a summing circuit having a first input coupled to the output of the first multiplier, a second input coupled to the output of the second multiplier, and an output providing a phase detected signal.

* * * * *